(12) United States Patent
Boyer et al.

(10) Patent No.: US 7,989,367 B2
(45) Date of Patent: Aug. 2, 2011

(54) REDUCING FORMALDEHYDE EMISSIONS FROM FIBERGLASS INSULATION

(75) Inventors: Peter Boyer, Conyers, GA (US); Kim Tutin, East Point, GA (US); Ramji Srinivasan, Alpharetta, GA (US)

(73) Assignee: Georgia-Pacific Chemicals LLC, Atlanta, GA (US)

( * ) Notice: Subject to any disclaimer, the term of this patent is extended or adjusted under 35 U.S.C. 154(b) by 550 days.

(21) Appl. No.: 11/478,980

(22) Filed: Jun. 30, 2006

(65) Prior Publication Data

US 2008/0003346 A1    Jan. 3, 2008

(51) Int. Cl.
   *B32B 27/12*    (2006.01)
   *B32B 24/04*    (2006.01)
   *B32B 27/42*    (2006.01)

(52) U.S. Cl. ........ 442/121; 442/160; 442/161; 442/162; 442/163; 442/378; 442/381

(58) Field of Classification Search .......... 442/160–163, 442/121, 378, 381
See application file for complete search history.

(56) References Cited

U.S. PATENT DOCUMENTS

| | | |
|---|---|---|
| 2,870,041 A | 1/1959 | Waddle et al. |
| 3,108,990 A | 10/1963 | Baxter |
| 3,912,836 A | 10/1975 | Johansson |
| 3,957,431 A | 5/1976 | Pai et al. |
| 3,983,094 A | 9/1976 | O'Shea |
| 4,101,489 A | 7/1978 | Reitz et al. |
| 4,101,498 A | 7/1978 | Snyder |
| 4,108,598 A | 8/1978 | Payet |
| 4,127,382 A | 11/1978 | Perry |
| 4,176,105 A | 11/1979 | Miedaner |
| 4,255,102 A | 3/1981 | Smedberg et al. |
| RE30,860 E | 2/1982 | Swidler et al. |
| 4,331,438 A | 5/1982 | Pai |
| 4,342,610 A | 8/1982 | Ray, Jr. |
| 4,346,181 A | 8/1982 | Allan |
| 4,374,814 A | 2/1983 | Gaylord |
| 4,376,807 A | 3/1983 | Cannon et al. |
| 4,396,390 A | 8/1983 | Hendrix et al. |
| 4,397,756 A | 8/1983 | Lehmann |
| 4,409,375 A | 10/1983 | Hartman et al. |
| 4,443,354 A | 4/1984 | Eian |
| 4,458,049 A | 7/1984 | Diem et al. |

(Continued)

FOREIGN PATENT DOCUMENTS

DE    2847975    5/1980

(Continued)

OTHER PUBLICATIONS

George Myers. Effects of Post-Manufacture Board Treatments on Formaldehyde Emission: A Literature Review (1960-1984). Forest Products Journal-1986, vol. 36, No. 6, pp. 41-51.

(Continued)

*Primary Examiner* — Lynda Salvatore
(74) *Attorney, Agent, or Firm* — Michael S. Kerns

(57) ABSTRACT

A process for making a fibrous product using a binder based on a formaldehyde-containing resin and especially for making fiberglass insulation products, and to the fibrous products themselves, wherein the fibrous product has a backing sheet affixed thereto and the backing sheet is coated or impregnated with a formaldehyde scavenger composition, with the result that the fibrous products exhibit a reduced level of formaldehyde emission.

18 Claims, 3 Drawing Sheets

U.S. PATENT DOCUMENTS

| | | | |
|---|---|---|---|
| 4,472,165 A | 9/1984 | Gregorian et al. | |
| 4,501,628 A | 2/1985 | McGuire et al. | |
| 4,517,111 A | 5/1985 | Dorman et al. | |
| 4,547,350 A | 10/1985 | Gesser | |
| 4,678,686 A | 7/1987 | Park | |
| 4,753,746 A | 6/1988 | Mesmer et al. | |
| 4,757,108 A | 7/1988 | Walisser | |
| 4,892,719 A | 1/1990 | Gesser | |
| 5,108,798 A | 4/1992 | Guerro et al. | |
| 5,112,652 A | 5/1992 | Greene | |
| 5,160,679 A | 11/1992 | Greene | |
| 5,206,204 A | 4/1993 | Tsutsumi et al. | |
| 5,215,768 A | 6/1993 | Vinci et al. | |
| 5,231,063 A | 7/1993 | Fukumoto et al. | |
| 5,286,363 A | 2/1994 | Anderson et al. | |
| 5,296,584 A | 3/1994 | Walisser | |
| 5,318,802 A | 6/1994 | Ishikawa et al. | |
| 5,318,990 A | 6/1994 | Strauss | |
| 5,340,868 A | 8/1994 | Strauss et al. | |
| 5,358,748 A | 10/1994 | Mathews | |
| 5,362,784 A | 11/1994 | Brodie, III et al. | |
| 5,395,494 A | 3/1995 | Anderson et al. | |
| 5,409,769 A | 4/1995 | Fukumoto et al. | |
| 5,413,827 A | 5/1995 | Brodie, III et al. | |
| 5,530,048 A | 6/1996 | McDonald et al. | |
| 5,538,761 A | 7/1996 | Taylor | |
| 5,578,371 A * | 11/1996 | Taylor et al. | 442/327 |
| 5,603,927 A | 2/1997 | Fukumoto et al. | |
| 5,612,405 A | 3/1997 | Bainbridge | |
| 5,670,585 A | 9/1997 | Taylor | |
| 5,674,971 A | 10/1997 | Graves | |
| 5,684,118 A | 11/1997 | Breyer et al. | |
| 5,693,684 A | 12/1997 | Rader | |
| 5,698,108 A | 12/1997 | Okun | |
| 5,705,537 A | 1/1998 | Hartman, Jr. et al. | |
| 5,710,239 A | 1/1998 | Tutin | |
| 5,717,031 A | 2/1998 | Degen | |
| 5,719,228 A | 2/1998 | Taylor | |
| 5,846,603 A | 12/1998 | Miller | |
| 5,885,303 A | 3/1999 | Payet | |
| 5,942,323 A | 8/1999 | England | |
| 5,952,440 A | 9/1999 | Walisser | |
| 6,004,522 A | 12/1999 | England | |
| 6,024,775 A | 2/2000 | Miller et al. | |
| 6,132,870 A | 10/2000 | Halladay | |
| 6,136,058 A | 10/2000 | Miller | |
| 6,194,512 B1 | 2/2001 | Chen | |
| 6,203,577 B1 | 3/2001 | Yanai et al. | |
| 6,245,438 B1 | 6/2001 | Dupre et al. | |
| 6,316,521 B1 | 11/2001 | Disch et al. | |
| 6,395,819 B1 | 5/2002 | Espiard | |
| 6,441,122 B1 | 8/2002 | DeMott et al. | |
| 6,472,469 B2 | 10/2002 | Bristol et al. | |
| 6,540,936 B1 * | 4/2003 | Takagi et al. | 252/184 |
| 6,555,616 B1 | 4/2003 | Helbing et al. | |
| 6,593,420 B1 | 7/2003 | Helbing et al. | |
| 6,608,162 B1 | 8/2003 | Chiu | |
| 6,638,882 B1 | 10/2003 | Helbing et al. | |
| 6,646,094 B1 | 11/2003 | Malhotra | |
| 6,706,808 B2 | 3/2004 | Delaviz et al. | |
| 6,706,809 B2 | 3/2004 | Tutin | |
| 6,723,670 B2 * | 4/2004 | Kajander et al. | 442/374 |
| 6,749,949 B2 | 6/2004 | Ljungar et al. | |
| 6,821,636 B2 | 11/2004 | Ljungar et al. | |
| 6,827,746 B2 | 12/2004 | Payet | |
| 6,861,099 B2 | 3/2005 | Gabrielson et al. | |
| 6,881,814 B2 | 4/2005 | Tang | |
| 6,893,579 B2 | 5/2005 | Espiard | |
| 6,906,132 B2 | 6/2005 | Belmares et al. | |
| 6,911,189 B1 | 6/2005 | Koller et al. | |
| 6,933,349 B2 | 8/2005 | Chen | |
| 2001/0009945 A1 | 7/2001 | Delaviz et al. | |
| 2003/0041735 A1 | 3/2003 | Yoshikawa | |
| 2003/0099850 A1 | 5/2003 | Belmares et al. | |
| 2003/0224119 A1 | 12/2003 | Coventry-Saylor | |
| 2003/0224120 A1 | 12/2003 | Coventry-Saylor | |
| 2004/0028876 A1 * | 2/2004 | Mizuno | 428/113 |
| 2004/0048531 A1 | 3/2004 | Belmares et al. | |
| 2004/0131874 A1 | 7/2004 | Tutin | |
| 2004/0250683 A1 | 12/2004 | Soane et al. | |
| 2005/0161054 A1 | 7/2005 | Sasaki et al. | |
| 2005/0236606 A1 * | 10/2005 | Toas et al. | 252/601 |
| 2005/0279116 A1 | 12/2005 | Park et al. | |
| 2006/0053824 A1 | 3/2006 | Jung | |
| 2006/0057923 A1 | 3/2006 | Jaffee | |
| 2006/0130451 A1 | 6/2006 | Ding et al. | |
| 2006/0141121 A1 | 6/2006 | Yoshikawa | |
| 2006/0222877 A1 | 10/2006 | Khabbaz | |
| 2007/0173155 A1 * | 7/2007 | Shoemake et al. | 442/164 |
| 2007/0287018 A1 * | 12/2007 | Tutin et al. | 428/505 |
| 2008/0003902 A1 | 1/2008 | Boyer et al. | |
| 2008/0038971 A1 | 2/2008 | Tutin et al. | |
| 2008/0118568 A1 | 5/2008 | Smets et al. | |
| 2008/0138526 A1 | 6/2008 | Tutin et al. | |
| 2008/0233333 A1 | 9/2008 | Tutin et al. | |
| 2008/0233334 A1 | 9/2008 | Tutin et al. | |
| 2008/0286472 A1 | 11/2008 | Tutin et al. | |
| 2009/0004391 A1 | 1/2009 | Olang et al. | |

FOREIGN PATENT DOCUMENTS

| | | |
|---|---|---|
| DE | 4112296 A1 | 10/1991 |
| JP | 52-124999 A | 10/1977 |
| JP | 53-009709 | 1/1978 |
| JP | 59147069 A | 8/1984 |
| JP | 61-285973 | 12/1986 |
| JP | 11-165379 * | 12/1997 |
| JP | 10058588 A | 3/1998 |
| JP | 10138205 A2 | 5/1998 |
| JP | 10195209 A | 7/1998 |
| JP | 10296918 A | 11/1998 |
| JP | 11-042741 A | 2/1999 |
| JP | 11-114041 | 4/1999 |
| JP | 11-223023 * | 8/1999 |
| JP | 11-223023 A | 8/1999 |
| JP | 11333813 A2 | 12/1999 |
| JP | 2000-301667 A | 10/2000 |
| JP | 2001-178805 A | 7/2001 |
| JP | 2002-273145 A | 9/2002 |
| JP | 2003/001747 A | 1/2003 |
| JP | 2004181045 A | 7/2004 |
| JP | 2005125587 A | 5/2005 |
| JP | 2005194634 A | 7/2005 |
| JP | 2007-021929 A2 | 2/2007 |
| JP | 2007021929 A2 | 2/2007 |
| WO | WO 01/94436 | 12/2001 |
| WO | 02/072324 A1 | 9/2002 |
| WO | WO 02/072323 | 9/2002 |
| WO | 2004/039545 A1 | 5/2004 |
| WO | WO 2006/104455 | 10/2006 |
| WO | 2007/082837 A1 | 7/2007 |

OTHER PUBLICATIONS

I. Andersen, G. R. Lundqvist and L. Molhave. The Effect of Air Humidity and Sulphur Dioxide on Formaldehyde Emission from a Construction Material (Chipboard). Holzforschung und Holzverwertung 28 (1976) 5, pp. 120-121.

N. Minemura, S. Imura, S. Hirata and H. Takahashi. Research on the Deodorization of Urea Resin-Bonded Plywood. Hokkaido Forest Products Research Institute. Research Report #65, Jun. 1976, pp. 53-87. Translation pagination: pp. 1-57.

ASTM Designation: C 665-91. Standard Specification for Mineral-Fiber Blanket Thermal Insulation for Light Frame Construction and Manufactured Housing. Published Nov. 1991. pp. 251-255.

J. Frederic Walker. Formaldehyde. $3^{rd}$ Edition. pp. 250-253, 486-487 and 620-623.

Southern Ionics, Inc. Sulfur Products Handbook (Brochure) Copyright 2004.

PCT International Search Report, PCT/US2007/069941, Jul. 30, 2008, European Patent Office.

PCT International Search Report, PCT/US2007/071987, Jul. 30, 2008, European Patent Office.

PCT International Search Report and Written Opinion for PCT/US2008/066505, mailed Sep. 23, 2008, 8 pages, European Patent Office, Rijswijk, Netherlands.

* cited by examiner

REDUCING FORMALDEHYDE EMISSIONS FROM FIBERGLASS INSULATION

FIELD OF THE INVENTION

The present invention relates to a method (and a related product configuration) for reducing formaldehyde emissions from articles prepared using formaldehyde-containing resins and relates especially to a method for reducing formaldehyde emissions from fiberglass products, such as fiberglass insulation.

BACKGROUND OF THE INVENTION

Formaldehyde-based resins or formaldehyde-containing resins, such as urea-formaldehyde (UF) resins, phenol-formaldehyde (PF) resins, including PF resins extended with urea (PFU) and melamine-formaldehyde (MF) resins find widespread use as adhesives and bonding agents for making a wide variety of products.

For example, PF and PUF resins in particular have been the mainstays of fiberglass insulation binder technology over the past several years. Such resins are inexpensive and provide cured fiberglass insulation products with excellent physical properties.

Fiberglass insulation, used generally in an uncompressed mat or blanket form, provides heat insulation for roof and wall structures in residential and commercial buildings, and is used in a compressed form as insulation for pipes and other conduits, and also is used in a variety of other molded forms.

Such fiberglass insulation products are easy to install and provide an economical and effective insulating barrier to reduce heat loss through the roof and wall structures of buildings and through the surface of pipes and other conduits or containers used to contain hot or cold fluids and other materials.

Fiberglass insulation mats and blankets often are shipped in a compressed, rolled form to facilitate transportation and reduce costs. When such compressed bundles of fiberglass are used at a job site, it is important that the compressed fiberglass product recover a substantial amount of it pre-compressed thickness. If not, the product will suffer a decrease is its thermal insulation and sound attenuation properties. Fiberglass insulation made with PF and PUF resins is able to recover most of its pre-compressed thickness, thus contributing to the wide acceptance of these resins as binders in this application.

The ability of these formaldehyde-based resins to provide the necessary performance benefits at a reduced cost relative to other adhesive technologies has thus made formaldehyde-based resins, including UF, PF and PUF resins, popular in a variety of products that find their way into commercial and residential uses.

One of the drawbacks of using these resins, both for making insulation and for other consumer products, however, is the potential for formaldehyde emissions from the finished article. It has long been observed that gaseous formaldehyde is released from such articles, some of which is attributable to unreacted formaldehyde in the cured resin binder and some of which is attributable to degradation or decomposition products generated over time under acidic conditions, elevated temperatures, and/or high humidity.

Thus, there is a continuing need for new methods for reducing formaldehyde emission in products produced using formaldehyde-based or formaldehyde-containing resins.

One of the common forms of conventional fiberglass insulation is an elongated mat or blanket of uniform width and thickness, having a backing sheet, possibly of a vapor impervious material, adhesively secured to one side surface of the mat or blanket. This mat or blanket often is formed in a continuous process by compressing the fiberglass mat or blanket against an adhesively coated surface of the backing sheet material. Such a method is an economical and an efficient means of forming a conventional fiberglass insulation product that is easy to handle and install. The present invention takes advantage of this conventional product configuration to produce fiberglass insulation products having a reduced tendency to emit formaldehyde into the environment.

DETAILED DESCRIPTION OF THE INVENTION

Figure 1:
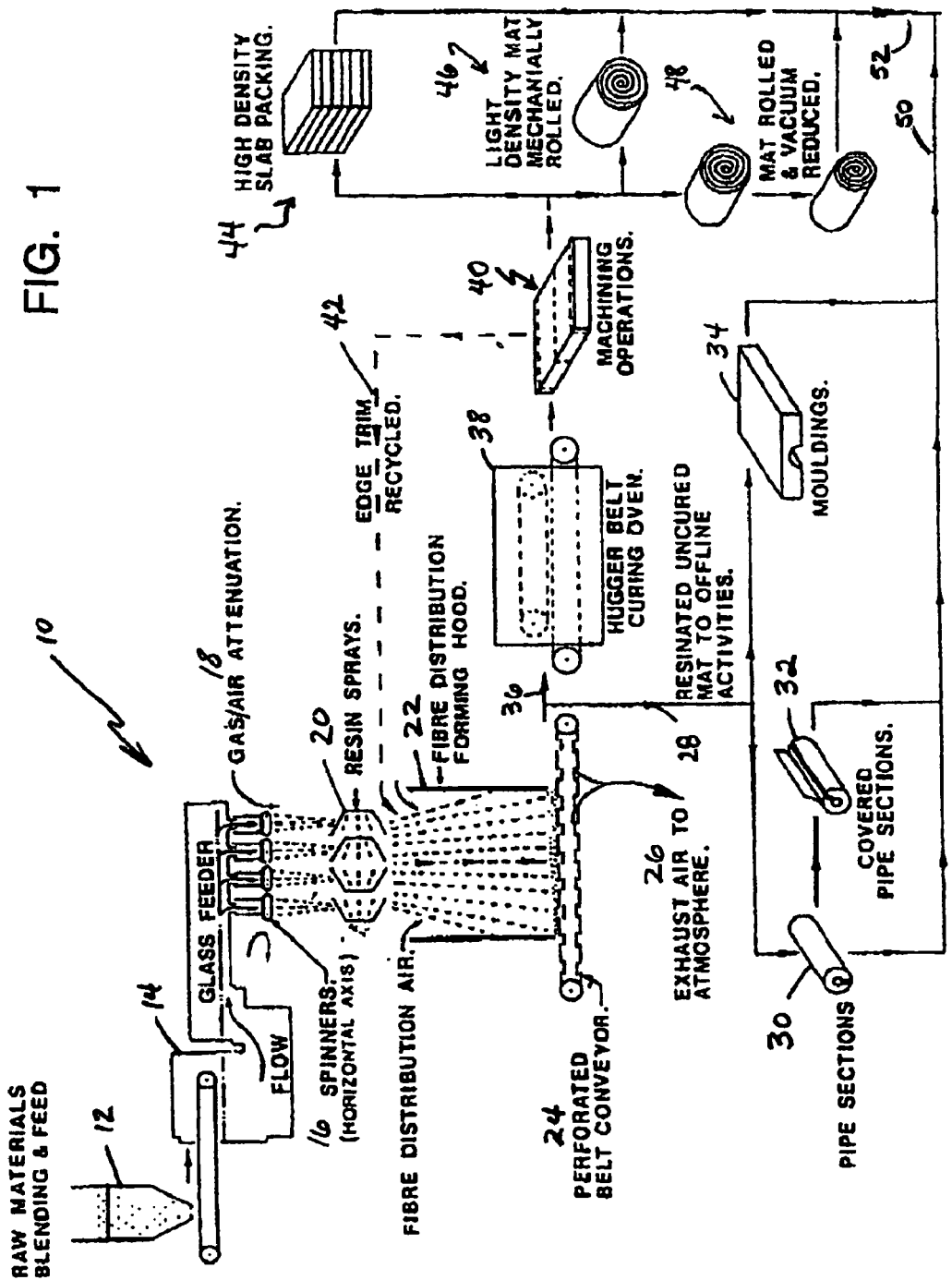
FIG. 1 schematically illustrates a typical way of making a wide variety of fiberglass insulation products, which can be modified in accordance with the present invention to have a reduced tendency to emit formaldehyde.

The present invention is directed to a method for reducing the amount of formaldehyde emitted into the surrounding environment by a product made with, or otherwise containing a formaldehyde-containing resin binder.

The invention is directed specifically to a method for reducing the amount of formaldehyde emitted into the surrounding environment by fiberglass insulation products made using a formaldehyde-containing resin binder.

According to the invention, the fiberglass insulation is provided with a backing sheet, wherein the backing sheet is coated or impregnated with an effective amount of a formaldehyde-scavenging composition placed in mass transfer contact with the formaldehyde-emitting fiberglass insulation. The presence of the formaldehyde scavenger-coated or impregnated backing sheet serves to trap formaldehyde, preferably through a covalent interaction, that is emitted by the fiberglass insulation and this trapping reduces the level of formaldehyde emitted from the insulation.

As used herein, the phrase "formaldehyde-containing resin" or "formaldehyde-based resin" means a resinous, thermosetting composition made from a molar excess of formaldehyde and one or more formaldehyde-reactive monomers such as phenol, urea, acetone, melamine and the like. Such resins typically contain free, i.e., unreacted formaldehyde, and exhibit formaldehyde emissions both during their cure and in the absence of an effective treatment, following their cure. Such resins are well known to those skilled in the art and do not require a detailed description. Such resins are commercially available from resin suppliers such as Georgia-Pacific Resins, Inc.

One formaldehyde-containing resin commonly used in connection with the manufacture of a wide variety of products including composite wood products and fiberglass insulation is made by reacting a molar excess of formaldehyde with phenol in the presence of an alkaline catalyst such as sodium hydroxide. Before this resin is used for making fiberglass insulation, it is commonly premixed with urea and the urea is allowed to react with residual formaldehyde, such as for 4-16 hours, before a binder is prepared for making the fiberglass insulation.

As used herein, "curing," "cured" and similar terms are intended to embrace the structural and/or morphological change which occurs to an aqueous binder of a formaldehyde-containing resin, such as, for example, by covalent chemical reaction (crosslinking), ionic interaction or clustering, improved adhesion to the substrate, phase transformation or inversion, and hydrogen bonding when the resin is dried and heated to an infusible condition.

The terms "applied," "coated" and "impregnated" are used throughout the application to characterize the physical relationship between the formaldehyde scavenger composition and the backing sheet on to which the formaldehyde scavenger composition is applied and retained. The terms "coating" and "coated" are more apt terms to describe the form of the formaldehyde scavenger composition when applied on to impervious backing sheets. The terms "impregnating" and "impregnate" are more apt terms to describe the form of the formaldehyde scavenger composition when applied onto permeable or porous backing sheets into which the composition can saturate. Applicants intend such phrases as "applying a formaldehyde scavenger composition to a backing sheet," "application of a formaldehyde scavenger composition to a backing sheet" and "a backing sheet carries a formaldehyde scavenger composition" to embrace both of these physical forms.

The term "cured binder" means the cured formaldehyde-containing resin.

By "reduced tendency to emit formaldehyde" and related phrases are meant that a product, such as fiberglass insulation, exhibits a lower level of formaldehyde emission than the product would have exhibited if made with the same binder but in the absence of the formaldehyde scavenging technique, such as the method of the present invention.

As used herein, "aqueous" means water and mixtures composed substantially of water.

As used throughout the specification and claims, the terms "mat," "batt" and "blanket" are used somewhat interchangeably to embrace a variety of fibrous substrates of a range of thicknesses and densities, made by entangling short fibers, long continuous fibers and mixtures thereof. Particularly preferred are mats, batts, or blankets made using heat resistant fibers.

In a first aspect, the present invention is directed to a method for reducing the amount of formaldehyde that is emitted into the surrounding environment from a fiberglass insulation product manufactured using a formaldehyde-containing resin binder. A key feature of the method is the application of, i.e., coating or impregnating, a formaldehyde scavenger composition, often applied as an aqueous mixture comprising a formaldehyde scavenger, onto or into a substrate suitable for use as a fiberglass insulation backing sheet. The formaldehyde scavenger-coated or impregnated substrate is then used as a backing sheet for the fiberglass insulation product.

In another aspect, the present invention provides a fiberglass insulation product that comprises a non-woven association or agglomeration of fibers, typically heat resistant (e.g., glass) fibers, bonded together at a variety of densities with a cured formaldehyde-containing resin and having a substrate (e.g., backing sheet) positioned adjacent to the bonded fibers, wherein the substrate (e.g., backing sheet) is coated or impregnated with an amount of a formaldehyde scavenger composition sufficient to reduce the amount of formaldehyde emitted from the mat.

The invention will now be described with reference to FIG. 1, which schematically illustrates a common glass fiber production system 10 that produces a wide variety of fiberglass insulation products that can benefit from the present invention.

In this illustrated embodiment, the raw materials for glass fiber formation are blended in a blender 12 and fed from there into a molten glass fiber production system 14. Thereafter, fiber attenuation generally is performed by centrifuging molten glass though spinners 16 or by fluid jets (not shown) to form discontinuous glass fibers of relatively small dimensions. Using the spinner system 16, the molten glass is extruded through openings while air and/or other gases (gas/air attenuation 18) are blown onto the fibers. This process forms discontinuous glass fibers, and such systems are conventional and known to those skilled in the art.

After glass fiber formation, a curable formaldehyde-containing binder is generally formulated as a liquid and is applied usually by spraying or fogging (sprayer 20) onto the hot glass fibers emerging from the fiber attenuation mechanism and the binder coated glass fibers are passed through a fiber distribution forming hood 22 for collection on a perforated conveyor belt 24. Gas and/or air blowing on the coated fibers in the fiber distribution forming hood 22 and on the conveyor belt 24 help dry the binder on the fibers and bind fibers together to form a glass fiber mat or blanket.

The dynamics of the binder application is such that much of the water in the binder is evaporated as the hot fibers are cooled by contact with the aqueous binder. The resin binder then becomes tacky holding the mass of fibers together as the resin begins to set. The fibers are collected on a conveyor belt 24 in a generally haphazard manner to form a non-woven mat. The depth (thickness) of the fibers forming the mat is determined by the speed of fiber formation and the speed of the conveyor belt 24. The air or gas flowing through the assembly is exhausted to the atmosphere via exhaust system 26 (if necessary, after appropriate filtering or other treatment).

After leaving the fiber distribution forming hood 22, the binder-coated (or "resinated") uncured glass fiber mat may be moved to various offline production steps or systems, as illustrated by path 28 in FIG. 1. For example, prior to curing, the glass fiber mat may be formed into pipe sections (uncovered 30 or covered 32), or otherwise molded into a desired shape 34. Curing of the binder can take place after the offline activities illustrated downstream from path 28 or coincident with the various shaping steps.

As another alternative, after leaving the fiber distribution forming hood 22, the binder-coated uncured glass fiber mat material may be moved along path 36 to a curing oven 38. While a hugger belt type curing oven 38 is illustrated as an example in FIG. 1, curing also may take place in a mold or in any other appropriate curing device, without departing from the invention. After curing, the glass fiber mat may be further processed in any appropriate manner. For example, as illustrated in FIG. 1, various machining operations may take place at machining station 40, such as cutting, trimming, etc., and excess or non-used glass fibers (e.g., from a cutting or trimming operation) may be recycled back to the fiber distribution forming hood 22 along recycle line 42. Further processing may include glass fiber mat slab stacking 44 (e.g., for high density molded glass fiber products), mechanical rolling 46 (e.g., for low density glass fiber insulation products), or rolling and vacuum reducing 48 for distribution of compressed rolls of building insulation.

The formaldehyde-containing resin binder composition, after it is applied to the glass fibers, is heated to effect drying and curing. In the embodiment illustrated in FIG. 1, after the initial portion of this heating (primarily drying) which occurs as a result of the transfer of heat from the hot fibers to the aqueous binder applied to the fibers (as the recently formed hot glass fibers are cooled by the aqueous binder), the mat can be passed through an oven 38. The duration and temperature of the heating in the oven will affect the rate of drying, processability and handleability, degree of curing and property development of the resulting fibrous mat. The curing temperatures are usually within the range from 50 to 300° C., and preferably within the range from 90 to 230° C. and the curing time will usually be somewhere between 3 seconds to about 15 minutes. Of course, other temperatures and times can be used depending upon particular binder formulations and the present invention is not limited to any specific set of conditions.

After processing, the uncured and/or cured glass fiber products may be moved to an appropriate location for storage, shipment, or other use, as generally illustrated by paths 50 and 52.

These fibrous products can be formed as relatively thin products of about ⅛ to ¼ inch or they can be formed as thick mats of 6 to 8 inches or even more. Depending on formation conditions, the density of the products also can be varied from relatively fluffy low density products (e.g., wall insulation) to higher densities of 6 to 10 pounds per cubic foot or higher (e.g., pipe insulation), as is well understood by those skilled in the art.

Continuous fibers also may be employed in the form of mats or blankets fabricated by swirling the endless filaments or strands of continuous fibers, or they may be chopped or cut to shorter lengths for mat, batt or blanket formation.

In fiberglass insulation products, heat resistant fibers generally are bonded together into an integral structure with an aqueous curable binder, typically an aqueous formaldehyde-containing resin. One particularly common resin within the group of formaldehyde-containing resins is the heat curable, i.e., thermosetting, resin systems of the phenol-formaldehyde (PF) type. Included within this group also are PF resins that have been modified by the addition of urea (PFU resins). These resins are typically synthesized in an aqueous reaction medium under alkaline reaction conditions, generally established using an alkali metal hydroxide and especially sodium hydroxide. In making these resins, phenol is reacted with a molar excess of formaldehyde, normally to a very low level of residual phenol. In the case of PFU resins, an amount of urea basically in an amount sufficient to react with the residual formaldehyde is subsequently added and is reacted, typically for about 4 to 16 hours.

Another common class of formaldehyde-containing resins often used as a binder in making thin fiber products is the thermosetting urea-formaldehyde (UF) resins. UF resins also are reacted (produced) under alkaline conditions. UF resins used in binder formulations for making fiber products, such as air filters which may be about one inch thick, also are commonly cured under acid conditions using a latent acid catalyst such as triethylamine sulfate.

Such formaldehyde-containing resins binders provide a strong bond between fibers, with sufficient elasticity and thickness-recovery to permit reasonable shipping and in-service deformation of the fibrous products, such as fiberglass insulation.

As shown by the various options in FIG. 1, the glass fiber mat may be compressed and shaped into a variety of different products, whether it is passed through a curing oven 38 or otherwise processed.

As noted, the drying and curing functions may be carried out in two or more distinct steps, if desired. For example, the binder may first be heated at a temperature and for a time sufficient to substantially dry but not to substantially cure the binder composition and then heated for a second time at a higher temperature and/or for a longer period of time to effect curing (thermosetting). Such a preliminary "drying" procedure, generally referred to as "B-staging", may be used to provide binder-treated product, for example, in roll form, which may at a later stage be cured, with or without forming or molding into a particular configuration, concurrent with the curing process. This makes it possible, for example, to produce binder-impregnated semifabricates which can be molded and cured elsewhere.

In accordance with the present invention, the fiberglass insulation product, whether a high density molded product (such as duct board used in constructing HVAV ducts), a roll of fiberglass insulation destined for use in insulating the walls of building structures, or a pipe insulation, is provided with a backing sheet that carries a formaldehyde scavenger composition.

Figure 2:
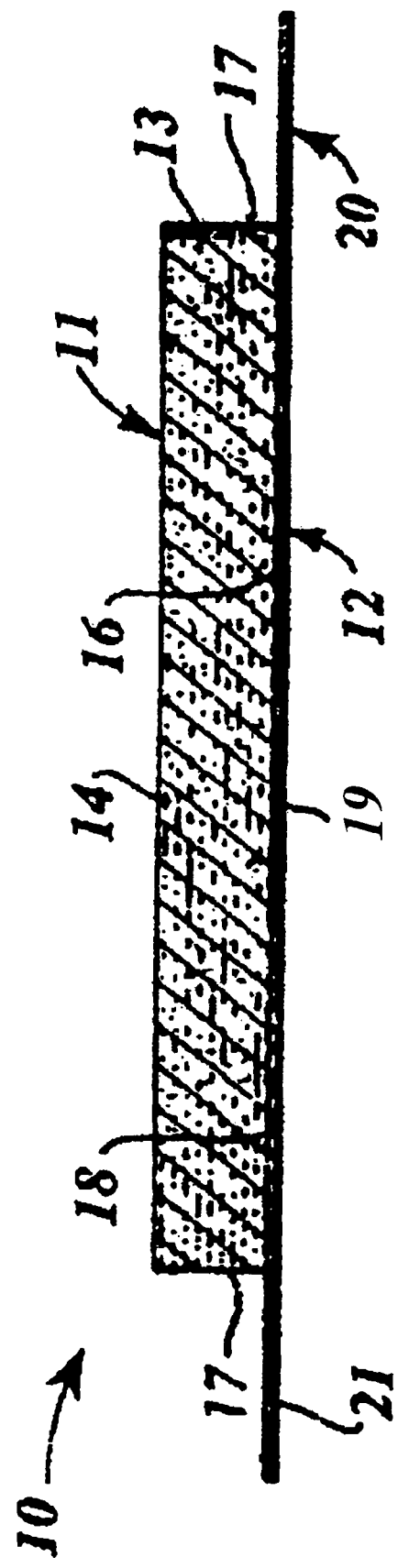
FIG. 2 illustrates a fiberglass insulation product of the present invention, shown is a cross-sectional view, taken along line 2-2 of FIG. 3.
Figure 3:
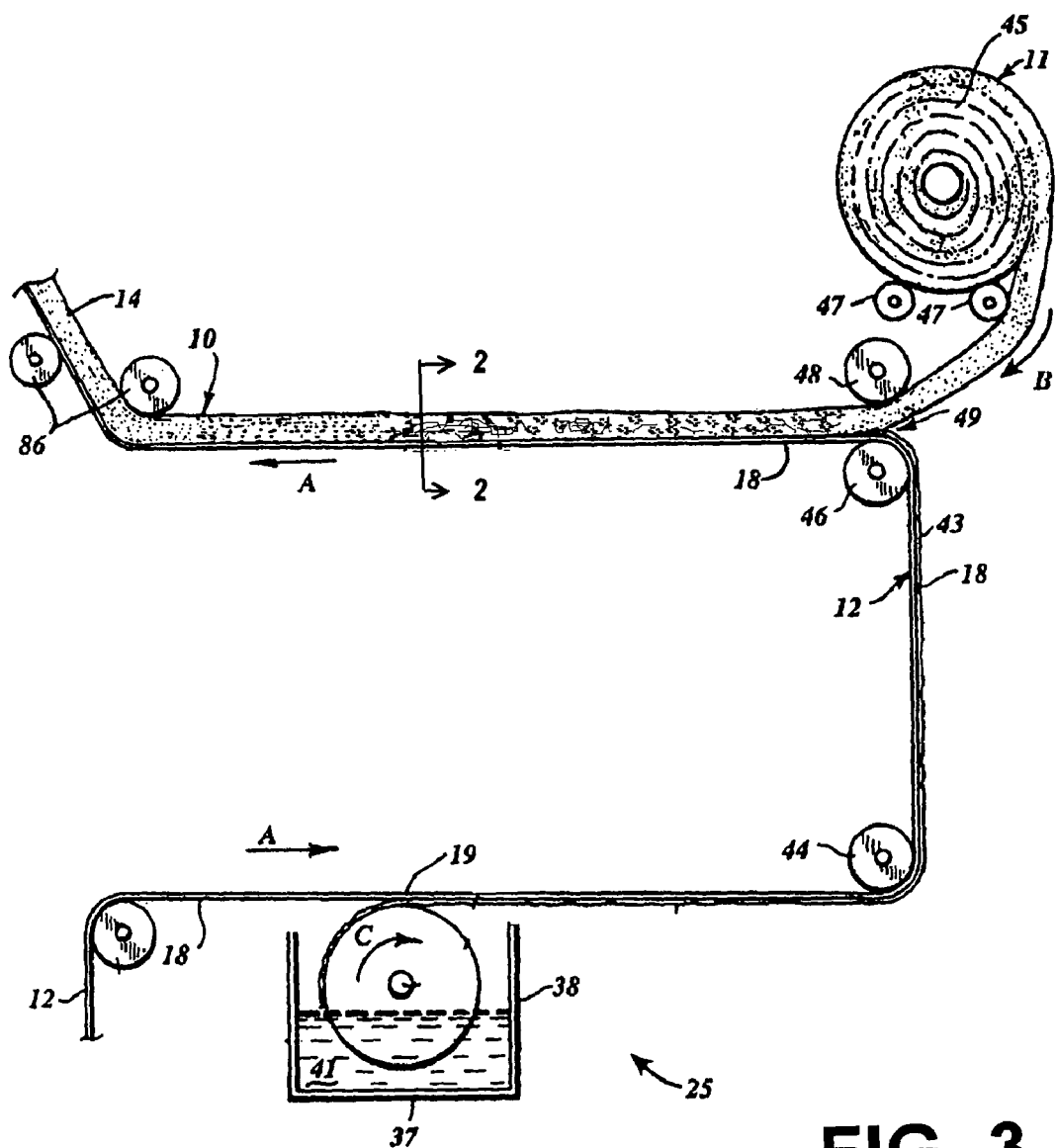
FIG. 3 is a schematic illustration of an apparatus and process for forming a fiberglass insulation product of the present invention.

FIG. 2 illustrates, in cross-section taken along line 2-2 of FIG. 3, a sheet of fiberglass insulation 10 constructed according to the present invention by affixing a backing sheet 12 to a fiberglass mat or blanket 11 made with a formaldehyde-containing resin binder. In this embodiment, the fiberglass mat or blanket 11 has a rectangular cross-section with an upper surface 14, a lower surface 16 and opposed parallel side surfaces 17. The fiberglass blanket 11 can be of almost any width so as to be compatible with the structure to which it is applied, and its thickness, for residential applications, usually will be between 3 to 16 inches.

In accordance with the present invention, the backing sheet 12 can be any of a wide variety of suitable materials for forming a flat, often flexible, support layer, film or foil, including for example paper, cardboard, plastic (such as Mylar, polyethylene or polyvinyl chloride), metal (such as aluminum) and other similar materials. The sheet is generally flexible, but has a sufficient degree of inherent stiffness so as to provide the fiberglass mat or blanket 11 with stability. In many cases the sheet is made from a plastic or metal film to make it vapor impervious. The backing sheet 12 often has an adhesively coated inner surface 18 for attaching it to the fiberglass mat or blanket 11, a back surface 19 and opposed parallel side edges 20 and 21. The back surface 19 of the backing sheet 12 can be covered with one or more additonal layers of facing material if desired, such as a heavy gauge paper, particularly in those embodiments where a thin foil is used for an inner layer of backing sheet 12.

Indeed, the backing sheet can have a single ply construction, or can have a multi-ply construction. The backing sheet can be made from a single material or can be made from a mixture of the various substrate materials identified above.

The backing sheet 12 has a width dependent on the width of the fiberglass mat or blanket 11. Preferably, the side edges 20 and 21 of the backing sheet 12 extend outwardly a small distance beyond the side surfaces 17 of the fiberglass mat or blanket 11 to form tabs of the backing material which facilitate installation. The fiberglass mat or blanket 11 can be installed in roof or wall structures of various types of buildings to provide an insulation barrier for such structures, with the tabs of the backing sheet being attached to studs or other parts of the building structure.

In order to reduce the emission of formaldehyde from the fiberglass mat or blanket 11, the backing sheet 12 carries a formaldehyde scavenger composition. When using an impervious backing sheet material, the formaldehyde scavenger composition is coated on the inner surface 18 of the backing sheet. For porous backing sheets, the formaldehyde scavenger composition can either be coated on the inner surface 18, or can be impregnated though the thickness of the backing sheet 12. In this way, the formaldehyde scavenger composition is in a mass transfer relationship with the formaldehyde as it is emitted from the mat or blanket 12. While FIG. 2 shows a backing sheet situated on only one side of the mat or blanket 11, it is of course within the spirit of the present invention to provide a backing sheet on both sides of the mat or blanket 11.

Referring now to FIG. 3, one process for affixing the backing material of the present invention to a fiberglass insulation mat or blanket is schematically illustrated.

As illustrated in FIG. 3, a sheet of backing material 12 is advanced along its length from a supply, typically provided as a roll of the material (not shown), in the direction indicated by arrow A. The backing sheet material passes over an adhesive applicator 25 that engages a surface of the backing sheet and applies an adhesive material to a surface 18 of the backing sheet. In embodiments where the backing sheet does not already carry a formaldehyde scavenger composition, the adhesive composition 41 in adhesive reservoir 38 may also contains a formaldehyde scavenger, so that both an adhesive for affixing the backing sheet 12 to the fiberglass mat or blanket 11 and a formaldehyde scavenger are simultaneously applied to the backing sheet 12. Alternatively, there could be a separate step where the formaldehyde scavenger is applied to the backing sheet 12 before it engages the fiberglass mat or blanket 11.

The backing sheet 12 is advanced around a pair of guide rollers 44 and 46 which reorient the backing sheet 12 such that the adhesively coated surface of the backing sheet (and the surface that carries the formaldehyde scavenger composition) 18 faces upwardly towards a fiberglass mat or blanket 11, which is advanced along its length from another supply, roll 45, onto the adhesively coated surface 18 of the backing sheet 12 so that the backing sheet 12 and blanket or mat 11 become adhesively attached.

The fiberglass mat or blanket supply roll 45 rests on feed rolls 47, and the mat or blanket material 11 advances along its length feeding a substantially continuous length of fiberglass mat or blanket material 11 into contact with the adhesively coated surface 18 of the backing sheet 12. A blanket guide roller 48, about which the fiberglass blanket 11 passes, is positioned parallel to upper guide roller 46, between upper guide roller 46 and the fiberglass blanket feed rollers 47. The blanket guide roller 48 guides the fiberglass blanket 11 into contact with the adhesively coated surface 18 (and the surface that carries the formaldehyde scavenger composition) of the backing sheet 12 as indicated at 49.

In an alternative embodiment for making fiberglass insulation products, the process could be arranged to deposit the formaldehyde-containing resin binder-treated fibers into a mold area through which a continuous sheet of backing material, such as paper or foil, which carries a formaldehyde scavenger composition, can be passed at any desired speed. The resin-treated insulation fibers can be deposited directly onto the backing material to any desired thickness. As the backing material continuously moves from the mold area it can pass through a drying oven to speed the setting of the adhesive. After passing from the drying oven the continuous strip of insulation can be rolled into a desired configuration for shipping or storage.

Suitable formaldehyde scavengers for use in the present invention, such as for preparing the formaldehyde scavenger composition used to coat or impregnate a backing sheet, for example, by using an aqueous mixture of the formaldehyde scavenger, include singly or in combination such materials as urea $((H_2N)_2C=O)$, low ratio melamine resins, i.e., melamine-formaldehyde resins made with a molar excess of melamine, sodium bisulfite, sodium metabisulfite, other alkali metal and alkaline earth metal bisulfites, sodium sulfite, ammonium bisulfite, ammonium sulfite, resorcinol, polyacrylamide, acrylamide, methacrylamide, melamine, biuret $(HN[(H_2N)C=O]_2)$, triuret $(N[(H_2N)C=O]_3)$, biurea $([HN(H_2N)C=O]_2)$, polyurea, acid salts of aniline, aromatic amines, aliphatic amines, diethylene triamine, triethylene tetraamine, tetraethylene pentamine, other polyamines and their salts, ammonia, polyamidoamines, amino acids, aromatic amino acids such as glycine, p-amino benzoic acid, ammonium bicarbonate, ammonium carbonate, polyethyleneamines, sodium sulfamate, ammonium sulfamate, methane sulfonamide, succinimide, dicyandiamide $(NCNH(H_2N)C=NH)$, sulfur compounds with valence state other than +6, ammonium sulfite, proteins (for example: soy, animal and plant proteins), an aminopolysaccharide, such as chitosan, thiourea $((H_2N)_2C=S)$, guanadine$((H_2N)_2C=NH)$, sodium salts of taurine, sulfanilic acid, disodium salt of glutamic acid, zeolites, permanganate and similar materials.

Depending on the particular embodiment, certain scavengers will likely exhibit more effective treatment. Optimal selection of a particular scavenger can generally be accomplished using routine experimentation. Particularly preferred formaldehyde scavengers are tetraethylene pentamine and sodium bisulfite (and the related material sodium metabisulfite).

An aqueous mixture of a formaldehyde scavenger (or formaldehyde scavengers) is prepared simply by mixing the scavenger (or scavengers) with water. The concentration of formaldehyde scavenger in the aqueous mixture can vary within wide limits (and is usually influenced by the aqueous solubility or miscibility of the scavenger), provided the amount does not interfere with the technique chosen for applying the aqueous mixture to the backing sheet material. Application of a formaldehyde scavenger composition is generally accomplished by one of a variety of conventional coating techniques such as, for example, air or airless spraying, padding, saturating, roll coating, curtain coating and other similar techniques. The present invention is not to be limited to the specific way in which the formaldehyde scavenger is applied onto the backing sheet material.

Usually, when using an aqueous mixture, it contains from as little as 0.01% by weight to as much 99% by weight or more of the formaldehyde scavenger, depending in many cases on the aqueous solubility or miscibility of the particular scavenger. Obviously, if the scavenger is used in a neat form, such as may be the case when using tetraethylene pentamine, which is a liquid at ambient conditions, the formaldehyde scavenger composition may be 100% scavenger. Thus, the present invention is not limited to any specific level of scavenger whether supplied as an aqueous scavenger mixture, or not.

The specific technique used to apply a formaldehyde scavenger composition to the backing sheet material, such as paper, cardboard, fabric, glass mat, plastic, metal or a similar foil or film material, can be similar to those techniques that are commonly employed in papermaking operations to apply a sizing composition to the surface of a paper product. Depending on the particular scavenger being used, either a neat scavenger in a liquid form, or more usually an aqueous formaldehyde scavenger composition, may be applied to a surface of the backing sheet using a size press, by maintaining a puddle of the formaldehyde scavenger composition though nip rolls, or by flooding a surface of the backing sheet material with the assistance of a doctor knife blade. For example, a web of backing sheet material can be conducted through the nip of a roller-coater apparatus (various configurations are available), where the scavenger is applied. Alternatively, the formaldehyde scavenger composition may be sprayed onto the web of the backing sheet or can be applied by dipping the backing sheet into an aqueous composition of the formaldehyde scavenger, or by using one of the wide variety of conventional coating techniques known to those skilled in the art. Backing sheet material that is treated with a scavenger, such as an aqueous mixture of a scavenger, is then dried as needed at an elevated temperature to produce a backing sheet carrying the scavenger composition.

The nature of the backing sheet influences whether the backing sheet material is coated or impregnated with the formaldehyde scavenger composition. Non-porous or impermeable backing sheets will receive only a surface coating of the formaldehyde scavenger composition. In contrast, porous substrates will tend to be impregnated at least partially through the thickness of the backing sheet depending upon the porosity of the substrate and the rheological property of the formaldehyde scavenger composition. For example if a paper or cardboard material is used as the backing sheet material, the formaldehyde scavenger composition might also be added at the wet end of the paper-making process itself. In this way the total thickness of the backing sheet material can be impregnated with the formaldehyde scavenger composition.

Application of the formaldehyde scavenger to the backing sheet can be accomplished either as a post-production operation of making the backing sheet or as a portion of the backing sheet production process itself. The present invention is not limited to the way in which the formaldehyde scavenger composition is applied onto, or impregnated into, the backing sheet material.

The formaldehyde scavenging composition is applied onto or impregnated into the backing sheet material in an amount such as to provide an effective amount of the formaldehyde scavenger composition for trapping or removing formaldehyde emitted from the fiberglass insulation product. Preferably, the formaldehyde scavenger composition is applied in an amount of about 0.1 wt. % to about 200 wt. % (on a dry basis) based on the weight of the backing sheet material. Usually, the level is about 1 wt. % to about 70 wt. %, and most often from about 2 wt. % to about 50 wt. %.

A key advantage of the present invention is that because the application of the formaldehyde scavenger is independent of and not commingled with the formaldehyde-containing resin binder, the level of addition of the scavenger does not adversely impact the tensile properties of the cured binder essential for obtaining a fibrous mat with acceptable physical properties. As shown in the following examples, including high levels of the formaldehyde scavenger directly in the binder formulation (internal scavenger), as taught in the prior art, not only fails to adequately reduce the tendency of the cured product to emit formaldehyde but also disadvantageously reduces the tensile properties of the cured product.

Even though the formaldehyde scavenger is not intimately associated with the formaldehyde-containing resin binder, applicants have observed that placing the scavenger in a mass transfer relationship with the fiber mat on the backing sheet of the mat, provides sufficient contact between the scavenger and the formaldehyde emitted by the mat to reduce the amount of formaldehyde released into the environment. Indeed, in experiments they have conducted applicants have observed a reduction in formaldehyde emission to a non-detectable level.

In some cases the formaldehyde scavenger may be a solid that can be melted to produce a molten liquid and the present invention contemplates applying such a molten form of the formaldehyde scavenger to the backing sheet material. In the case of a molten liquid, the scavenger can be sprayed or dripped on to the backing sheet substrate. In the case of a solid form of the scavenger, the scavenger also can be applied as small particles that either can be retained within the porosity of a porous backing sheet material such as paper (such as when a filler is commonly added during the preparation of paper), or can be affixed with the separate application of an adhesive to the surface of the backing sheet material (much like the attachment of abrasive particles to a backing sheet when preparing sand paper). Preferably, a non-formaldehyde-containing adhesive binder is used for affixing such solid particles as a surface coating on the backing sheet substrate.

Particles that pass through a 3 Mesh screen (Tyler Screen designation) but are retained by a 100 mesh screen generally should be suitable for such uses. Other suitable particle sizes to use, depending on the specific embodiment contemplated, will be apparent to those skilled in the art. The particles can be mixed with a binder formulation or can be sprinkled onto a backing sheet substrate coated with the wet binder formulation. Alternatively, the scavenger could be loaded onto an inert carrier material, such as by coating or absorbing the scavenger, for example using an aqueous solution, onto sepiolite, activated carbon, activated carbon fibers, zeolite, activated alumina, vermiculite, diatomaceous earth, perlite particles or cellulose fibers, with the scavenger-loaded inert material then being applied to the backing sheet substrate.

The formaldehyde scavenger composition used in connection with the present invention may, in addition to the formaldehyde scavenger itself, contain one or more additives to provide desired characteristics to the composition. Suitable additives include, but are not limited to, dyes and pigments, humectants or moisturizers, preservatives, antimicrobial agents, corrosion inhibitors, surfactants or wetting agents, pH buffers, viscosity control agents, mutual solvents and combinations thereof. Use of any particular additive, or any specific combination of additives will depend on the actual formaldehyde scavenger selected and the particular way in which the composition is to be employed. Considerations influencing the preparation of a suitable formaldehyde scavenger composition are well within the skill of the art.

For example, there is some indication that the performance of the formaldehyde scavenger applied in accordance with the present invention may be improved by the presence of a moisturizer or humectant. The moisturizer or humectant could simply be the humidity available in the ambient environment, or may be a polyol, or any other liquid, preferably a low volatility liquid, added a part of a formaldehyde scavenger composition, For example, the moisturizer could simply be water added as part of an aqueous solution of a formaldehyde scavenger, a polyol, such as glycerine, propylene glycol, trimethylol propane, or diethylene glycol, a polymine, an amine salt, calcium chloride and other deliquescent materials, polyacrylamides and other super absorbent materials, starch or other liquid. Such as low volatility liquids, may be applied as part of the formaldehyde scavenger composition to a backing sheet substrate. In cases where the scavenger is applied as an aqueous solution and dried, applicants suspect that residual moisture in the dried scavenger coating, enhanced by the presence of a polyol, or other moisturize may assist the formaldehyde-reducing performance of the scavenger.

Applicants have also observed that when using sodium bisulfite as a scavenger for fiberglass insulation made with PFU resin binder that the sodium bisulfite scavenger has an ameliorating effect on color development observed in the mat. In particular, mats having a cured PFU resin binder typically develop what can be characterized as a dark or dingy yellow color. When such mats are treated with a sodium bisulfite scavenger, the yellow color becomes lighter or more muted as the level of treatment increases. One benefit of this effect is it become easier to color the mat a different color (such as pink or blue) by supplying a dye or pigment as part of the manufacturing process. Less treatment may be needed to color the more lightly colored mats produced when using the formaldehyde scavenger treatment of the present invention.

Fibrous products made in accordance with the present invention may be used for applications such as, for example, insulation batts, rolls, molded parts, as reinforcing mat for roofing, flooring, or gypsum applications, as air filters, as roving, as microglass-based substrate for printed circuit boards or battery separators, as filter stock, as tape stock, and as reinforcement scrim in cementitious and non-cementitious coatings for masonry.

As recognized by those skilled in the art, not all fiberglass products are provided with backing sheets. Fiberglass products that may lack a backing sheet include low density rolled fiberglass insulation, some pipe insulation products and certain molded insulation products to name a few. Fortunately, such products that are made with formaldehyde-containing resins can still benefit from the improved method of reducing formaldehyde emissions developed by the present inventors.

As demonstrated in the following examples, applicants have discovered that by placing a substrate, which carries a formaldehyde scavenging composition, e.g., which is coated or impregnated with a formaldehyde scavenging composition, into a hermetically sealed package (Ziplock®-type storage bags were used in the examples) along with the fiberglass insulation products, one can obtain a significant reduction in the level of formaldehyde emissions from the fiberglass product. That same principle can be applied to fiberglass products that are not provided with a backing sheet.

In particular, to implement the technique of the present invention is this context, fiberglass products made with a formaldehyde-containing resin first are packaged in a way to isolate the products from the environment. The products can be suitably isolated by encasing them is a sealed plastic film, by placing them in a plastic bag, or by wrapping them with a similar packaging material. Placed inside the sealed package along with the fiberglass product, is a substrate carrying a formaldehyde scavenger composition. The substrate for use in this embodiment of the invention can take many forms, such as paper saturated with a formaldehyde scavenger composition, a vial containing, for example, a solid form of a formaldehyde scavenger composition that is freely available to the atmosphere in the package, and many other configurations. In an alternative embodiment, instead of placing a separate substrate inside the package, the inner surface of the packaging material itself, i.e., the surface of the package exposed to the interior space of the package, would carry, e.g., would be coated or impregnated with a formaldehyde scavenger composition. Thus, in this embodiment, the packaging itself comprises a substrate carrying a formaldehyde scavenger.

Though such configurations, the formaldehyde scavenger composition is placed in a mass transfer relationship with the fiberglass insulation product. Once in this mass transfer relationship, there is be sufficient contact between the scavenger and the formaldehyde emitted by the product to reduce the amount of formaldehyde released into the environment from the product It will be understood that while the invention has been described in conjunction with specific embodiments thereof, the foregoing description and following examples are intended to illustrate, but not limit the scope of the invention. Other aspects, advantages and modifications will be apparent to those skilled in the art to which the invention pertains, and these aspects and modifications are within the scope of the invention.

COMPARATIVE EXAMPLE 1

To simulate the manufacture of fiberglass insulation, batts were prepared in the laboratory as follows. A roll of 1 inch thick, un-bonded, fiberglass was obtained from Resolute Manufacturing and divided into individual sheets weighing about 30 grams. Individual un-bonded fiberglass sheets were placed in a tray. A formaldehyde-containing binder was placed into a reservoir and air was used to aspirate the binder into a fine mist. The mist was drawn through each individual batt using an air exhaust hood. This technique caused fine binder droplets to be deposited onto and into the batt. In each experiment, approximately eight grams of binder was deposited onto each sample of the glass batt. Following binder application, the batt was next cured in a forced air oven for two minutes at 425° F. (218° C.) to cure the binder. After curing, the batt was transferred to a Ziplock®-type storage bag until the sample could be tested using a consistent technique (emissions were collected using 20 mls of 1% NaOH in an impinger with the air flow into the impinger set at 1.0 l/min. and the impinger solutions were tested for formaldehyde emissions using a standard chromotropic acid method) in a dynamic micro chamber (DMC) to test its formaldehyde emission characteristic. A DMC is described in Georgia-Pacific Resins, Inc. U.S. Pat. Nos. 5,286,363 and 5,395,494.

Two batt samples were prepared (two replicates) for each of the experiments and testing examined two different treatment scenarios. In all cases, the binder was formulated from an aqueous phenol-formaldehyde resin that is commercially available from Georgia-Pacific Resins, Inc. as resin 209G47. The aqueous resin was mixed with a 40% by weight aqueous solution of urea in an amount of 1 part urea solution per approximately 7 parts aqueous resin. The mixture was allowed to "pre-react" overnight at room temperature before the binder was applied to the batts. Shortly before application to the batts, 1 part by weight of an aqueous ammonium sulfate solution (20% by weight ammonium sulfate), as a cure accelerator or catalyst, was added per approximately 2 parts by weight of the binder to complete the base binder formulation.

In the Control experiment, only the above-formulated binder was applied to the fiberglass batt. In a Comparative experiment, a formaldehyde scavenger (sodium bisulfite) also was added to the above-formulated binder and was dissolved in the binder shortly before the binder was applied to the batts. The scavenger was added to the binder in an amount of 1 part scavenger (sodium bisulfite) per approximately 17.6 parts of the aqueous resin used in the binder (this corresponds to 1 part scavenger per approximately 9 parts phenol-formaldehyde resin solids).

The raw results of each of the two replicates obtained from the DMC testing for each experiment, the average results and the levels of reduction in formaldehyde emission are reported in Table 1 below. The internal scavenger provided a modest improvement in the formaldehyde emission characteristic of the fiberglass product.

TABLE 1

Formaldehyde Emission Results
(ppm Formaldehyde)

| EXPERIMENT | Control | Comparative |
|---|---|---|
| Replicate 1 | 0.190 | 0.174 |
| Replicate 2 | 0.182 | 0.168 |
| Average | 0.186 | 0.171 |
| % Reduction from Control | — | 8.1 |

COMPARATIVE EXAMPLE 2

The tensile strengths (dry and hot/wet) of glass mat hand sheets bonded using a typical phenol-formaldehyde resin binder was compared to hand sheets prepared with binders having sodium bisulfite, as a formaldehyde scavenger, added to the resin to assess the impact on tensile properties of an internal scavenger.

Binders were formulated from an aqueous phenol-formaldehyde resin that is commercially available from Georgia-Pacific Resins, Inc. as resin 209G56. The aqueous resin first was mixed with a 40% by weight aqueous solution of urea in an amount of 1 part urea solution per approximately 1.8 parts aqueous resin. The mixture was allowed to "pre-react" overnight at room temperature to yield a pre-mix. Shortly before application to a glass mat, 1 part by weight of aqueous ammonia (28% by weight ammonia); and 5 parts by weight of an aqueous ammonium sulfate solution (20% by weight ammonium sulfate), as a cure accelerator or catalyst, were added per approximately 38 parts by weight of the pre-mix to complete the base binder formulation.

In addition to testing the tensile properties of the base binder formulation (designated the Control), two binder formulations also were prepared for testing one having an additonal 5% by weight of sodium bisulfite added as a formaldehyde scavenger (designated Comparative A) and the other having an additional 50% by weight of sodium bisulfite added (designated Comparative B), both as a percentage of binder solids (defined as resin solids plus urea solids).

Various amounts of water were added to these binder formulations to yield a binder with the same amount of total binder solids (20% solids as resin and urea solids). In particular, 1.78 parts water per part of premix was added to the Control, 1.76 parts water per part premix was added to complete the binder of Comparative A, and 1.55 parts water per part premix was added to complete the binder of Comparative B.

Hand sheets were prepared by soaking the mats in the formulated binders and vacuuming excess resin binder off the mat. Following application of the various binders, each sample was cured in a forced air oven for two minutes at 401° F. (205° C.) to cure the binders.

Tensile strengths (dry and hot/wet) of hand sheets prepared using the various techniques (Control, Comparative A, and Comparative B) were determined. Dry tensile strengths of the mats were measured by subjecting samples of each hand sheet to breaking in a tensile tester (QC-1000 Materials Tester by the Thwing Albert Instrument Co.). Hot/Wet tensile strengths of the mats were measured by initially soaking the hand sheets in 185° F. (85° C.) water for 10 minutes followed by breaking them in a tensile tester (QC-1000 Materials Tester by the Thwing Albert Instrument Co.) while the samples were still hot and wet. Fourteen (14) breaks for each sample were measured and the average of the breaking strengths was determined.

The testing results are presented in Table 2. As shown, by using an internal scavenger, in the manner of Comparative A and Comparative B, increasing the level of added scavenger results in a degradation in tensile strength as compared to the Control Example.

TABLE 2

Hand Sheet Tensile Test Results
(lbs tensile strength)

| EXPERIMENT | Control | Comparative A | Comparative B |
|---|---|---|---|
| Ave. Dry Tensile | 59.24 | 55.18 | 41.76 |
| Ave. Hot/Wet Tensile | 39.68 | 40.28 | 22.85 |

EXAMPLE 3

A fresh bag of unfaced R-13 insulation, bearing product code 1685, was obtained from Knauf Fiberglass. This insulation product was prepared using a PUF resin binder. The insulation was cut into pieces of 8" by 20" and the pieces were immediately stored in individual Ziplock®-type storage bags.

Blotter paper samples, 12" by 12", were obtained from Georgia-Pacific's paper group and were treated by saturating them with various solutions of sodium bisulfite and then dried in an oven. Two samples were impregnated with an aqueous solution of 33.3% by weight sodium bisulfite and then dried for one minute at 70° C. One sample contained 21.2 g of the treatment composition after drying (Sample A) and the other one contained 20.0 g (Sample B). Two other samples were impregnated with a 1:1 by weight mixture of glycerine and an aqueous solution of 33.3% by weight sodium bisulfite and then dried for four minutes at 105° C. One sample contained 39.9 g of the treatment composition after drying (Sample C) and the other one contained 40.8 g (Sample D).

After the blotter samples were prepared, each of them was cut in half to make two 6" by 12" pieces per sample and then each blotter paper sample was transferred to a Ziplock®-type storage bag containing the R-13 samples. The samples were held for 72 hours at ambient conditions and then tested using the DMC protocol referenced in Comparative Example 1.

Product formaldehyde emission results are presented below in Table 3. For the controls, an untreated piece of blotter paper was placed in the bag with the insulation sample. The reported results are the averages obtained from all of the samples tested at a particular condition.

| Formaldehyde Emission Results (ppb Formaldehyde) | |
|---|---|
| R-13 Controls | 40 |
| Aq. Sodium Bisulfite | Non-detectable* |
| Aq. Sodium Bisulfite/Glycerine | Non-detectable* |

*Less than 2 ppb

EXAMPLE 4

Using the fresh unfaced R-13 insulation of Example 3, the loss on ignition (LOI) value of the samples was estimated at 5% by weight. The 8" by 20" pieces of the R-13 insulation weighed, on average, about 110 g. Thus, the organic fraction of each sample, at a 5% LOI, was about 5.5 g.

Blotter paper samples, 6" by 6", were obtained from Georgia-Pacific's paper group and were treated by saturating them with various solutions of sodium bisulfate and then dried in an oven at 40° C. for one minute. Two samples were impregnated with an aqueous solution of 0.55% by weight sodium bisulfate and then dried (Samples A1 and A2), two samples were impregnated with an aqueous solution of 5.5% by weight sodium bisulfate and then dried (Sample B1 and B2) and two sample were impregnated with an aqueous solution of 33.3% by weight sodium bisulfate and then dried (Samples C1 and C2). Sample A1 retained 8.1 g of the treatment composition after drying, while Sample A2 retained 7.8 g. Sample B1 retained 8.2 g of the treatment composition after drying, while Sample B2 retained 9.3 g. Finally, Sample C1 retained 9.7 g of the treatment composition after drying, while Sample C2 retained 10.6 g.

After the blotter samples were prepared, each of them was transferred to a Ziplock®-type storage bag containing the R-13 samples. The samples were held overnight at ambient conditions and then tested the next morning using the DMC protocol referenced in Comparative Example 1. The samples from duplicate bags were placed into the DMC together (simultaneously).

Product formaldehyde emission results are presented below in Table 4. For the Control, untreated pieces of blotter paper (Samples X1 and X2) were saturated with 10.0 g (Sample X1) and 9.8 g (Sample X2) of water and dried in the same manner as the treated paper. Sample X1 retained 7.6 g of the water after drying, while Sample X2 retained 7.4 g.

TABLE 4

Formaldehyde Emission Results
(ppb Formaldehyde)

| | |
|---|---|
| R-13 Controls | 50.4 |
| 0.55% Aq. Sodium Bisulfite | 70.4 |
| 5.5% Aq. Sodium Bisulfite | 19.0 |
| 33.3% Aq. Sodium Bisulfite | Non-detectable |

The present invention has been described with reference to specific embodiments. However, this application is intended to cover those changes and substitutions that may be made by those skilled in the art without departing from the spirit and the scope of the invention. Unless otherwise specifically indicated, all percentages are by weight. Throughout the specification and in the claims the term "about" is intended to encompass + or −5%.

We claim:

1. A fibrous mat having fibers bonded to one another with a binder comprising a cured formaldehyde-containing resin and having a backing sheet adjacent the fibrous mat, wherein the backing sheet is selected from the group consisting of a sheet of paper, a metal foil, a glass mat, and a fabric and carries a formaldehyde scavenger composition in a mass transfer relationship to the fibrous mat and in an amount sufficient to reduce formaldehyde emissions from the fibrous mat.

2. The fibrous mat of claim 1 wherein the formaldehyde scavenger composition comprises a formaldehyde scavenger selected from the group consisting of urea, low mole ratio melamine resins, sodium bisulfite, sodium metabisulfite, sodium sulfite, sodium sulfamate, ammonium sulfamate, an acid aniline salt, ammonium bisulfite, ammonium sulfite, methane sulfonamide, succinimide, resorcinol, polyacrylamide, acrylamide, methacrylamide, melamine, diethylene triamine and its salts, triethylene tetraamine and its salts, tetraethylene pentamine and its salts, biuret, triuret, biurea, polyurea, aromatic amines, aliphatic amines, ammonia, polyamidoamines, ammonium bicarbonate, ammonium carbonate, polyethyleneamines, polyamines, dicyandiamide, a sodium salt of taurine, sulfanilic acid, sulfur compounds with valence state other than +6, ammonium sulfite, disodium salt of glutamic acid, an amino acid, a protein, an aromatic amino acid, an aminopolysaccharide, p-amino benzoic acid, thiourea, guanadine, zeolites and permanganate.

3. The fibrous mat of claim 1 wherein the formaldehyde scavenger is selected from the group consisting of tetraethylene pentamine, sodium bisulfite, and sodium metabisulfite.

4. The fibrous mat of claim 1 wherein the formaldehyde scavenger is sodium bisulfite.

5. The fibrous mat of claim 4 wherein the formaldehyde scavenger composition is present as solid particles.

6. The fibrous mat of claim 5 wherein the solid particles comprise the formaldehyde scavenger composition loaded onto an inert carrier.

7. The fibrous mat of claim 1 wherein the formaldehyde scavenger composition comprises between 0.1 and 200% by weight of the backing sheet.

8. A process of producing a fibrous mat of claim 1 wherein the fibrous mat comprises a cured formaldehyde-containing resin binder and the fibrous mat has a backing sheet selected from the group consisting of a sheet of paper, a metal foil, a glass mat and a fabric, the process comprising applying a formaldehyde-scavenger composition on to the backing sheet so that the formaldehyde-scavenger composition is in a mass transfer relationship to the fibrous mat.

9. The process of claim 8 wherein the formaldehyde scavenger composition is applied to the backing sheet as a liquid.

10. The process of claim 9 wherein the liquid is an aqueous mixture of a formaldehyde-scavenger.

11. The process of claim 8 wherein a neat form of the formaldehyde scavenger is applied to the backing sheet, 12. The process of claim 11 wherein the formaldehyde scavenger composition comprises solid particles of a formaldehyde scavenger.

13. The process of claim 12 wherein the formaldehyde scavenger is loaded onto solid particles of an inert carrier.

14. The process of claim 8 wherein the formaldehyde scavenger composition comprises a formaldehyde scavenger selected from the group consisting of urea, low mole ratio melamine resins, sodium bisulfite, sodium metabisulfite, sodium sulfite, sodium sulfamate, ammonium sulfamate, an acid aniline salt, ammonium bisulfite, ammonium sulfite, methane sulfonamide, succinimide, resorcinol, polyacrylamide, acrylamide, methacrylamide, melamine, diethylene triamine and its salts, triethylene tetraamine and its salts, tetraethylene pentamine and its salts, biuret, triuret, biurea, polyurea, aromatic amines, aliphatic amines, ammonia, polyamidoamines, ammonium bicarbonate, ammonium carbonate, polyethyleneamines, polyamines, dicyandiamide, a sodium salt of taurine, sulfanilic acid, sulfur compounds with valence state other than +6, ammonium sulfite, disodium salt of glutamic acid, an amino acid, a protein, an aromatic amino acid, an aminopolysaccharide, p-amino benzoic acid, thiourea, guanadine, zeolites and permanganate.

15. The process of claim 8 wherein the formaldehyde scavenger is selected from the group consisting of tetraethylene pentamine, sodium bisulfite, and sodium metabisulfite.

16. The process of claim 8 wherein the formaldehyde scavenger is sodium bisulfite.

17. The process of claim 8 wherein the formaldehyde scavenger composition comprises between 0.1 and 200% by weight of the backing sheet.

18. A fibrous mat produced by the process of claim 8, 9, 10, 11, 12, 13, 14, 15, 16 or 17.

* * * * *